United States Patent [19]

Brandsness et al.

[11] 4,416,497

[45] Nov. 22, 1983

[54] SPRING CLIP ELECTRICAL CONNECTOR FOR STRIP CONDUCTOR CABLE

[75] Inventors: Gordon T. Brandsness, White Bear Lake; Robert L. Ebright, Bloomington; Alexander J. Orosz, Roseville, all of Minn.

[73] Assignee: Sperry Corporation, New York, N.Y.

[21] Appl. No.: 286,746

[22] Filed: Jul. 27, 1981

[51] Int. Cl.[3] .............................................. H05K 7/12

[52] U.S. Cl. .......................... 339/17 F; 339/176 MF

[58] Field of Search ......... 339/176 MF, 17 F, 75 MF

[56] References Cited

U.S. PATENT DOCUMENTS 3,216,580 11/1965 Fricker, Jr. .................... 339/75 MP
3,602,870 8/1971 Willard .......................... 339/75 MP
3,851,294 11/1974 Palazetti et al. ................. 339/17 F

FOREIGN PATENT DOCUMENTS 1200801 8/1970 United Kingdom ........ 339/176 MF

*Primary Examiner*—Eugene F. Desmond
*Assistant Examiner*—David Pirlot
*Attorney, Agent, or Firm*—William C. Fuess; Kenneth T. Grace; Marshall M. Truex

[57] ABSTRACT

A strong U-channel shaped, spring clip of steel is used to retain by dual strong compressive clamping a strip conductor flexible flat ribbon cable at the edge of, and against a flat sheet substrate of epoxy or glass. Spring clamping is evenly uniformly exerted across all conductors across the width of the cable by finger-like spring segments integral with the clip. Stripped conductor ends of the ribbon cable are electrically connected to printed circuit lands upon the edge plane of the substrate by this clamping force. A second strong compressive force normal to the edge of the substrate is exerted by an elastomeric cellular silicone rubber pad at the base of the U-channel shaped spring clip which is held in strong compression when the spring clip is clamped upon the substrate. Assembly, disassembly, and reassembly are readily accomplished at zero sliding force or wear to connected conductors.

9 Claims, 8 Drawing Figures

SPRING CLIP ELECTRICAL CONNECTOR FOR STRIP CONDUCTOR CABLE

BACKGROUND OF THE INVENTION

The general area of the present invention is electrical connection and the specific area is electrical connection through forced contact of conductors within flexible, flat, printed strip conductor cable with corresponding printed circuit (pc) conducting lands on a printed circuit board or glass substrate.

Prior art connectors have been developed to provide low-cost Zero Insertion Force (ZIF) connectors to terminate flat printed conductor cable of flexible and conductive ink circuitry on pc boards or glass substrates. An example is the ZIF connector design development of AMP, Inc., Harrisburg, PA 17105, manufactured under the tradename "Connector Clip" and reviewed in the Dec. 17, 1979 issue of Design News, at page 70. Similarly to the present invention, the low-resistance electrical connections are obtained from direct, spring-forced contact between the plated surfaces of the cable conductors and the circuit strips of the board or plate. This prior art connector has only one component part and this part, a stainless steel stamping, has no electrical or insulating function.

This prior art stamping is claimed to provide a number of different mechanical functions. These include the anchoring of its own body to the printed circuit board or glass plate; the development of high normal forces required to reliable, low-resistance electrical connection; provision for relieving these spring-developed forces during Zero Insertion Force (ZIF) cable insertion and removal; prevention of overstressing of these springs during the ZIF operations; and positive positioning, locking, and strain relief of the cable. These various functions are produced by a simple design geometry. The stamping is produced by high-speed, progressive-die precision stamping techniques at low cost with negligible part-to-part variation in performance.

A second prior art connector is shown in U.S. Pat. No. 4,265,507 to D. L. Johnson for an Electrical Connector for Strip Conductors. This connector utilizes a U-channel shaped shell to clamp a multiple strip flat flexible conductor cable at the edge of a body member or substrate. The connector is claimed to support zero insertion forces and reliable positive connection in the face of environmental variation such as temperature, vibration and shock.

The present invention will be seen to endorse the concept of AMP and Johnson to utilize spring force to effectuate electrical connection to multiple strip conductors within a flexible flat cable. The present invention also endorses the Johnson concept that the conductor cable should be fixedly held at the edge of the substrate body by the clamping shell and that the shell itself should be fixedly held in position by securing means such as extending projections adapted to engage the connector shell. The present invention will be seen to differ from the prior art in a first instance in that a single large and wide spring is utilized to develop compressive force for the electrical connection of many conductors, as opposed to having each conductor connected through the force of an individual spring. The prior art of Johnson does not utilize a spring clip, but rather a rigid clip of plastic. This dielectric structure of the Johnson shell allows electrical insultation between the multiple contacted conductors. The present invention shows that if the insulation is stripped only from the substrate contacting side of the flat multiple strip conductor cable at the point of electrical contact, then the clip may be made from spring metal. This greatly simplifies the substrate member, which is essentially unmodified. Finally, the present invention teaches that an improved flexible cable securing force may be derived if the clipping connector utilizes an elastomeric pad to fixedly compress the conductor cable against the substrate body when such connector is seated.

SUMMARY OF THE INVENTION

The present invention of a spring clip electrical connector maintains all the prior art features of retaining aspects to lock the connector in place relative to the printed circuit board or glass plate, ZIF when making a connection, positive locking and strain relief of the cable when appropriately combined with a surrounding clamp and a low-cost, low-variation, high-speed repeatable production. The present invention utilizes an improved design geometry consisting of a large area resilient spring clip providing greatly improved high normal forces as are required for low-resistance electrical connection, a substrate mounted retainer guide plate for the spring clip, a cellular rubber pad to provide a retention force for both the connected cable and the spring clip itself, and a securing rod for positive locking of the entire connector apparatus in an operative position.

The basic prior art connector structure uses a succession of small springs—therefore necessarily weaker, more subject to variation due to normal material deviation, and more subject to connector localized mechanical stressing forces than would be a single large spring—to press a succession of individual electrical conductors within a flat printed conductor cable into a parallel succession of printed electrical lands upon a substrate in order to form a low-resistance electrical connection. The present invention shows an immediate design improvement to the development of high normal forces for this pressed condition. A large area integral resilient spring clip is utilized to generate an improved first high force normal to the plane of the substrate which is of greater magnitude than the force produced by each spring within a like dimensional array of spring segments. Finger-like spring segments integral with, and disposed only at the cable-contacting ends of, the spring clip serve to uniformly contact and transmit the improved first high normal force to the printed conductor cable. Uniformity of the force transmission is further augmented by a thin overlay protector strip of epoxy glass between the metal spring segments and the printed conductor cable.

The detailed structure at the point of compressively effectuated electrical connection between the parallel conductors of the printed conductor cable and the like succession of parallel conducting lands upon the substrate is such that the force generating spring clip is not electrically connected. This is because the insulating layer is stripped from only one side of the printed conductor cable. The stripped side exposing the interior conductors is pressed against the substrate by the spring clip which contacts only the insulation of the unstripped side. Lack of any electrical connection of any metal mass within the connector structure reduces circuit capacitance. In the preferred embodiment, the minor elements of a dual sided adhesive tape securing a very thin sheet of epoxy glass as a cable protector may also be employed between the spring clip and the insulated side of the printed conductor cable for the purpose of abrasion protection.

The present invention develops a second high force which is normal to the edge of the substrate to which the printed conductor cable is connected. This force is developed by a U-channel spring clip connector geometry which fixedly compresses an elastomeric pad of cellular rubber, located at the base of the U-channel, when the spring clip connector is retained in its clipped position about the edge of the substrate. An insulating layer only of the printed conductor cable is forcefully retained by this second high normal force for the purpose of holding the cut end of the printed conductor cable in fixed position. When a cable clamp is utilized to hold the cable on the other side of the area in which electrical connection is made under pressing spring force then the flat cable is positively positioned by clamping forces to each side of, and other than, those occurring solely at the point of electrical connection.

The spring clip is held in its position about the edge of the underlying substrate by a precision retainer block or other means for affixing the spring clip upon the substrate and in precision alignment thereto. In the preferred embodiment, the spring clip has tabs which latch a retainer block permanently glued to the non-connected side of the substrate. In such a position clipped about the edge of the substrate, and retained from removal by tabs, the elastomeric pad at the interior base of the spring clip channel is compressed and serves to forceably hold the spring clip in its affixed position as well as to hold the printed conductor cable.

The entire connector system such as allows development of this first high normal compressively connecting force and this second high normal positioning and retaining force reduces to three essential components, although considerable embellishments (e.g., a dual-sided adhesive tape to facilitate positioning), improvements (e.g., an aligning technique for the retainer block or a cable protector strip of epoxy glass) and supporting structure (e.g. retaining rods and cable clamps) will be shown. The present invention contains as a first component a generally U-channel shaped metal spring clip capable of powerfully clamping by spring force the series of conductors exposed by stripping away the insulation of one side, and at one end of a printed conductor cable to like series of printed circuit lands upon and at the edge of, a flat sheet substrate at the edge of which the spring clip is clipped. This first component spring clip may employ integral spring segments for uniform application of forces, may have features such as tabs or holes which are interactive with third components for retaining the spring clip upon the substrate, and may have features for interaction with anchoring rods or clamps of the likes for the purpose of positive stabilization of the entire connector system. The second essential component is the elastomeric rubber pad at the base of the generally U-channeled spring clip. When the spring clip is retained in its clipped position the elastomeric forces generated by this pad secure the insulation tail of the underpositioned flat cable against the substrate. The third essential component is a retainer block or like provision for fixedly retaining the spring clip first component and the printed circuit conductor cable positioned thereunder at a precision position clipped upon the edge of the substrate. This third "component" retaining feature could be integral with the substrate as by drilling holes into which tabs of the spring clip would latch, or as by using screws. The preferred embodiment of the present invention uses a plastic retainer block as the third component. This retainer block is aligned with the printed lands upon the substrate and then permanently glued to the substrate. When the spring clip is positioned about the substrate and held by this third component retainer block all alignments and forces can be positively, reliably, and repeatedly established.

The present spring clip edge connection of printed lands to flexible cable thusly shows a great deal of precision alignment (such as supports working at high densities), repeatable application of strong and even forces (such as establish good electrical connection), and strong positive retention control (such as make the electrical connections formed exhibit great immunity to thermal aging, thermal shock, physical shock and vibration). The retention control, in particular, establishes positive conductor position and is integral with the connection technique—not only added on as by cable clamps or strain relief. All such alignments, positive retention control and application of connective forces may be reliably and repeatably accomplished by a simple pliers-like hand tool at zero insertion force (ZIF) without wear or deterioration.

DESCRIPTION OF THE PREFERRED EMBODIMENT

Figure 1:
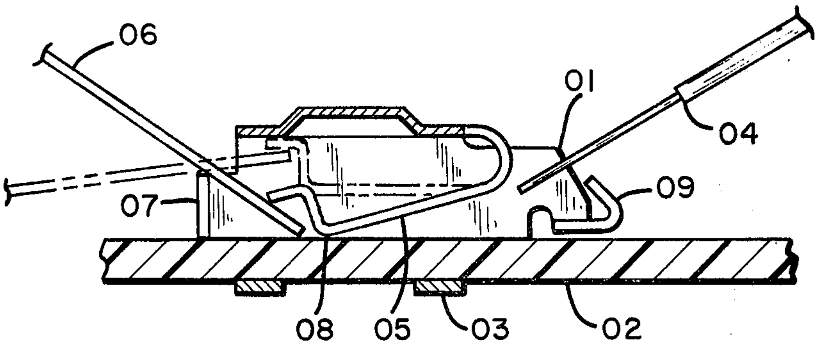
PRIOR ART Fig. 1
FIG. 1 shows a prior art connector.

A first prior art connector is shown in side view in FIG. 1. The particular connector illustrated is manufactured under the tradename "Connector Clip" by AMP, Inc., Harrisburg, PA 17105. The connector is a single stamping design for cables having flat conductors on 0.100 inch centers. The entire connector body 01 is manufactured from stainless steel with spring properties and corrosion resistance. The connector body 01 is fitted to an underlying pc board 02 by an interconnector 03. The interconnector 03 is a simple, multi-tabbed piece that is inserted into bored holes and soldered to conductors on the back of the board. The scored carrier strip is then broken off and the tabs are bent down to provide individual contacts for cable connection to conductive strips on the backside of the board. Flat conductor cable 04 is inserted under connector body 01 when the preloaded spring members 05 are suitably lifted by lifting tool 06. This position during insertion is illustrated in FIG. 1 by the dotted line representations. The lifting tool 06 operates against cable stop 07 during this zero insertion force operation. When the exposed conductors at the tip end of flat conductor cable 04 are properly inserted under preloaded spring members 05 the lifting tool 06 is withdrawn forcing the exposed conductors of flat conductor cable 04 into contact with board conductors 08.

When in this position, the now spring-clamped conductors of flat conductor cable 04 will be grabbed between v-notches of strain relief 09 and held from being forcibly extracted from the connector body 01. To facilitate this strain relief as performed by strain release 09 the cable may be notched at both edges at a point approximately 7/32 inch from the cable end. At this location the formed notches will engage the hooks of strain release 09 and the cable will be locked in place with strain relief. The electrical connection, meanwhile, is formed by the normal force of preloaded spring members 05 pressing the conductors of flat conductor cable 04 against board conductors 08.

Figure 2:
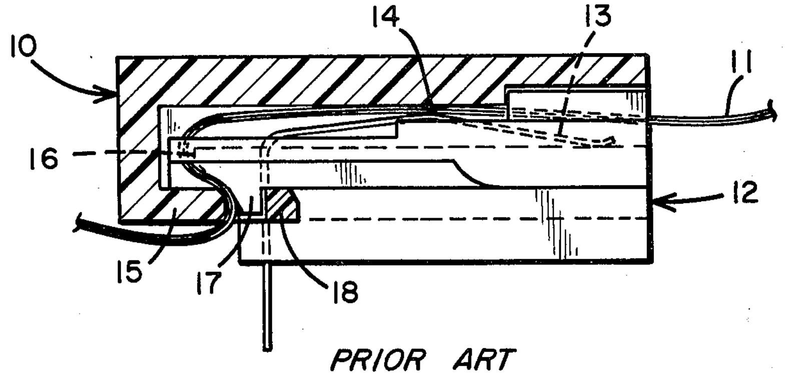
PRIOR ART Fig. 2
FIG. 2 shows a prior art connector.

A second prior art connector is shown in side view in FIG. 2. This electrical connector for strip conductors is patented in U.S. Pat. No. 4,265,507 to David L. Johnson. An exterior shell or cover 10 of dielectric material is adapted to fit multiple strip conductor cable 11 to block 12. The block 12 mounts a series of resilient electrical terminals or conductors 13 which are parallel to each other, which have a sharp contact point 14 at their apex, and which are bent so as to provide a compressive force against strip conductor cable 11 at the point of contact point 14 when cover 10 is affixed to block 12. Strain relief to cable 11 is applied between tip 15 and ledge 16 when cover 10 is latched over block 12. The cover 10 is held in this position by notches 17 which interact against projection 18 so that cover 10 cannot be withdrawn without further depressing cover 10 toward resilient terminals 13. A more complete description of this prior art connector is given in the referenced patent.

Figure 3:
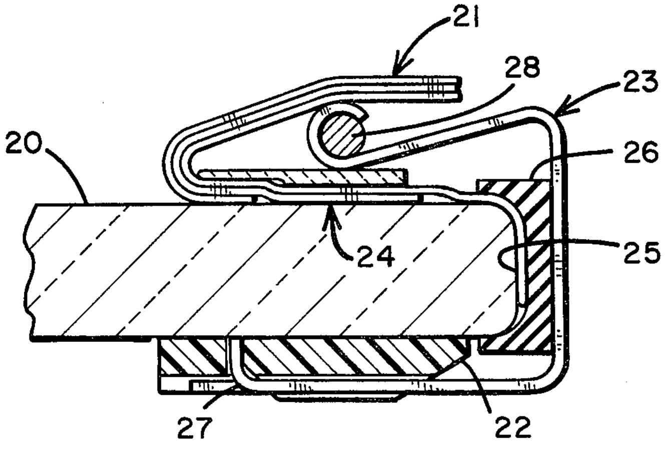
FIG. 3 shows a side view of the present invention of a spring clip electrical connector for strip conductor cable.

A side view, similar to the side view of FIGS. 1 and 2, of the present invention is shown in FIG. 3. The purpose of the invention is to connect flat conductor cable 21 to substrate body 20, which may be printed circuit or glass. The printed circuit lands upon substrate body 20 to which electrical connection will be effected are on the top of the substrate body 20 as shown in the perspective view of FIG. 3. At the lower side position of the substrate body 20 such is not used for electrical connection, a retaining block 22 is permanently affixed. This retaining block 22 may be permanently affixed to substrate body 20 by glue, screws, solder or the like. The retaining block 22 will be shown further in FIG. 5.

Continuing in FIG. 3, the retaining block 22 will itself serve as a retaining mechanism for spring clip 23. The spring clip 23 is seen to possess a generally U-channel shape in side perspective. It is comprised of metal material such as stainless steel, exerting a strong compressive force upon the substrate 20 held between the open ends of spring clip 23. This spring compressive force, normal to the top plane of substrate 20 at point 24, is utilized to exert a clamping connection force upon flat conductor cable 21 at point 24. The flat conductor cable 21 is exposed only on the underside surface of flat conductor cable 21, and is not itself electrically connected to the spring clip 23. A detailed view of this connection area will be shown in FIG. 6.

High normal retention forces are produced along edge 25 by cellular rubber insert 26. The cellular rubber 26 is under strong compressive force because spring clip 23 engages retaining block 22 at the point of tabs 27. The tabs 27 acting against retaining block 22 as permanently affixed to substrate 20 prevent the spring clip 23 from separating from substrate 20 to relieve compressively forced cellular rubber 26. The force of compressed cellular rubber 26 holds spring clip 23 in a firm fixed position. Consequently, the end tail of insulation of flat conductor cable 21 at the location of edge 25 is forced with extreme high normal forces against substrate 20 by cellular rubber 26. The progressive stripping of the flat conductor cable 21 such that conductors are exposed at point 24 while only the top insulating layer remains against edge 25 will be shown in expanded detail in FIG. 6. The rolled over lip of spring clip 23 may be threaded by an optional hold-down rod 28 of circular cross section. This securing fixture, along with cable clamps or guides or shields, will be further shown in FIG. 8. The basic spring clip electrical connector of FIG. 3 comprises, without more, a complete system for electrical connection of multiple parallel conductors within strip conductor cable to a like multiple of printed circuit lands upon an epoxy glass or glass substrate.

Figure 4:
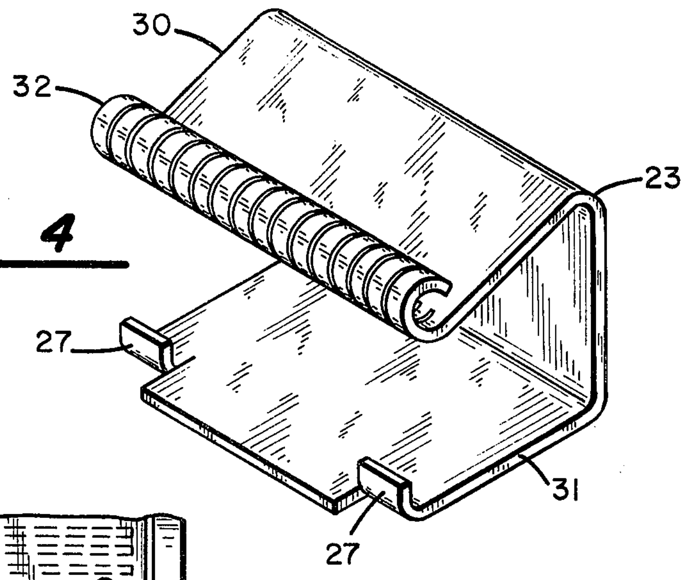
FIG. 4 shows a perspective view of the spring clip component of the present invention of a spring clip electrical connector.

The detail construction of metal spring clip 23 is shown in perspective view in FIG. 4. The dimensions such as support graspable connection of thirty-six conductor ribbon cable are approximately 1.180 inch length by 0.70 inch width by 0.40 inch height. The preformed channel of height 0.208 inches is less than the expected thickness of the substrate to be contacted. A large bend plane 30 will exert considerable force toward plane 31. Individual spring segments 32 will allow this considerable force to be evenly applied at the illustrated eighteen locations along the length of spring clip 23. These spring segments 32 are generally positioned one each over each pair of the multiple conductors of any ribbon cable to be held by this spring clip 23. The tabs 27 will be utilized to secure the spring clip 23 to the retaining block 22 as illustrated in FIG. 3.

Figure 5:
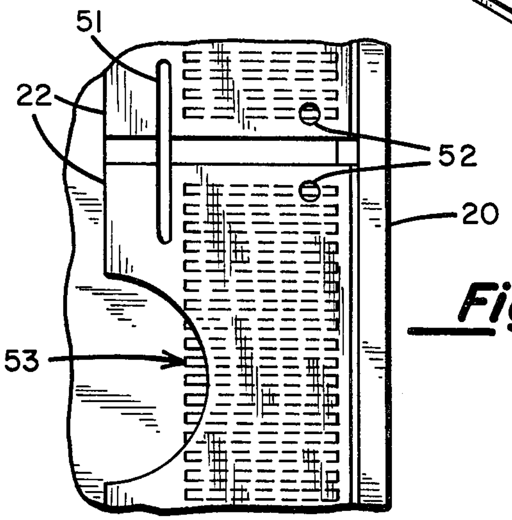
FIG. 5 shows the alignment of the retainer block upon the substrate.

The detail manner by which the retainer block 22 is aligned upon and affixed to substrate body 20 is further shown in FIG. 5. Portions of two retainer blocks 22 are shown in order to suggest that the present connector apparatus will support a number of closely spaced, spring clip connected, connector sites around the periphery of a substrate. Normally, if more than one flat conductor cable 21 (shown in FIG. 3) is to be connected than a single long retainer block will be affixed to substrate body 20 and a multiple number of spring clips 23 (shown in FIG. 3) will be clipped thereto. The slots 51 are the location into which the tabs 27 of spring clips 23 (both shown in FIG. 3) will fit. When held in position, the spring clip 23 should be accurately and securely holding the flat conductor cable 21 (shown in FIG. 3) on the opposite side of substrate body 20 from the retainer block 22, in a precise position. Therefore the retainer block 22, which holds spring clip 23, is precisely aligned on substrate body 20. In order to do so, orientation holes 52 may be placed along the entire length of retainer block 22. The retainer block 22 may also be relieved in a semi-circular arc as illustrated. This semi-circular relieved area also accords room for the pliers-like tip on a removal/insertion tool (not shown) upon seating spring clip 23 about substrate body 20 and retainer block 22. Through both the orientation holes 52 and the removed portion of the body the printed circuit lands on the other side of the substrate body 20 will be visible through a clear, or glass, substrate. When the position along the edge of, and in from the edge of, substrate body 20 is visually established to be correct as regards the flat conductor cable, substrate circuit lands, and particularly dimensioned spring clip through which electrical connection is desired, then the nominally plastic retaining blocks 22 may be permanently epoxy glued to substrate body 20.

The functional purpose of the retainer block or blocks 22 is thereby seen to be only to hold the spring clip 23 in a fixed position clipped about the edge of substrate body 20. Another securing method could have holes in the substrate, or projections (tabs) from the substrate (as in the prior art connector of Johnson). Similarly, the spring clips could be screwed or glued to the substrate directly. The preferred embodiment retainer block 22 illustrated in FIGS. 3 and 5, is accurate, cheap, readily assemblable, and supports rapid, strong, and positionally precise affixing of the spring clip 23 to the edge of the substrate body 20 through a clipping action which causes tabs 27 to catch within slots 51.

Figure 6:
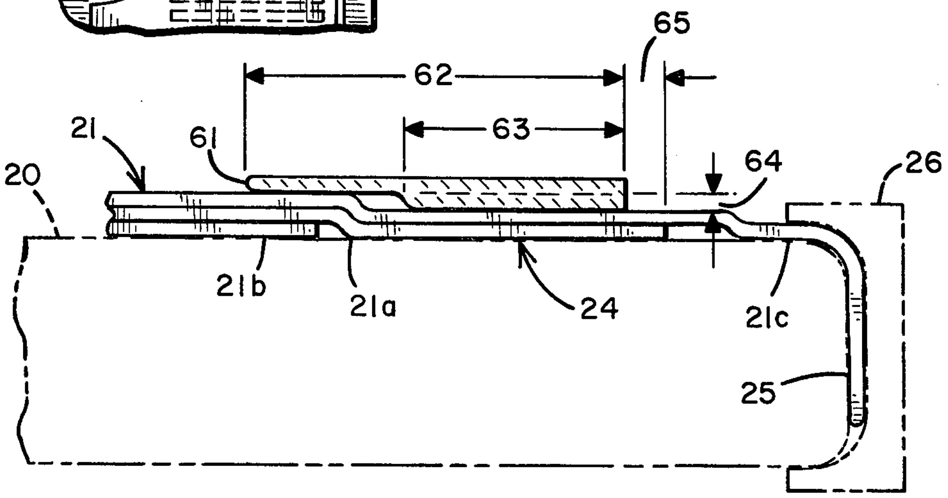
FIG. 6 shows an enlarged detail view of the strip conductor cable at the point of connection.

An enlarged detail view of strip conductor cable 21 at the points of electrical and mechanical connection to substrate body 20 is shown in FIG. 6. The orientation illustrated is for a spring clipped connection on the right edge of substrate body 20, shown in shadow line. The elastomeric rubber pad 26 is also illustrated in shadow line to show why strip conductor cable 21 assumes the contours illustrated when connected. In this preferred embodiment the strip conductor cable 21 is overlaid with an epoxy glass protector strip 61 at the area in which forced compression will be made by spring clip 23 (shown in FIG. 3). The utility of this overlay, the shape indicated, is that it distributes a small force into the unstripped region of the cable which is useful for temporary retention of the strip conductor cable 21 during the clipping on of spring clip 23 (shown in FIG. 3) and it also provides some minor evening and distributing of forces, plus some abrasion protection, at the point of compressed contact. When optionally employed, this protector strip will have the nominal dimensions of length 62 equals 0.50 inch wherein the body is of length 63 or 0.275 inch of that total while the remaining lip of length 62 is relieved in thickness by dimension 64 equaling a maximum of 0.015 inch. The dimension 65 of 0.03 inch is intended merely to show that should the optional epoxy glass protector strip 61 be employed, it is intended that it should not extend toward the substrate edge beyond that underlying conductor, or middle, layer of the flat conductor cable to which it is ultimately desired to transmit force for effecting electrical connection.

The manner in which flexible flat conductor cable 21 is exposed is shown in FIG. 6. The cable is comprised of a flat metal conductor strip 21*a*, normally copper, between two insulating layers 21*b* and 21*c*. A first side insulating layer 21*b* is terminated sufficiently to allow a length of metal conductor strip 21*a* to be exposed to, and pressed against, the printed circuit lands, nominally gold, of substrate body 20 at point 24. The preferred means of precision fabricating this three layer flexible flat conductor cable 21 is to etch back from a cut edge the exposed copper 21*a* as lies on insulating layer 21*c*. The insulating layer 21*b* is pressure bonded to the other two layers, forming the entirety of flexible flat conductor cable 21 with precision in all dimensions. As indicated by length 63 in FIG. 6, the total length along which compressive contract may be made is only about 0.275 inch. The width of the individual lands, and corresponding flat cable strip conductors, may be derived from FIGS. 4 and 5 and accompanying discussion. The width of the lands is 0.012±0.001 inch at 0.021 inch separation. Thus the effective area of electrical contact is small. The mechanical alignment and retention features of the present connector are intended to make and stably maintain each such small area in good electrical connection. The conductor layer 21*a* is etched or terminated at such extent as is beyond the area of electrical contact. Although continuation of this conductor layer 21*a* over the edge of substrate body 20 would add strength it also adds capacitance and the possibility of shorts should the conductor cable 21, now stripped of first side insulating layer 21*b*, become folded or contaminated. The second side insulating layer 21*c* is run over the edge of substrate body 20 and under the elastomeric pad 26 which is illustrated in light line in FIG. 6. During assembly, this insulating layer 21*c* may be conveniently held in position on edge 25 by an optional double sided adhesive tape which remains in place when the spring clip 23 (shown in FIG. 3) is seated. The elastomeric compressive force generated by pad 26 serves to hold conductor cable 21, through its tail of second insulating layer 21*c*, in a firm, fixed position. The conductor cable 21 is not only secured from pulling back from under point 24 of compressive electrical contact, but it is also aligned both along the edge of substrate body 20 and at a fixed distance in from the edge of that body. The actual dimensions in FIG. 4 through 6 should be determined in consideration of the particular connective application intended. The technique shown may be downsized to high densities of connection. In particular, the nominal dimensions outlined in the preceding discussion will support at least 257 separate electrical connections along a linear substrate edge of ten inches. If all edges of a square substrate body are connected, the number of separate connections possible is four times the number attainable on a single edge. When the present invention is employed to electrically connect a ten inch by ten inch plasma display panel, 1028 electrical connections are effected.

Figure 7:
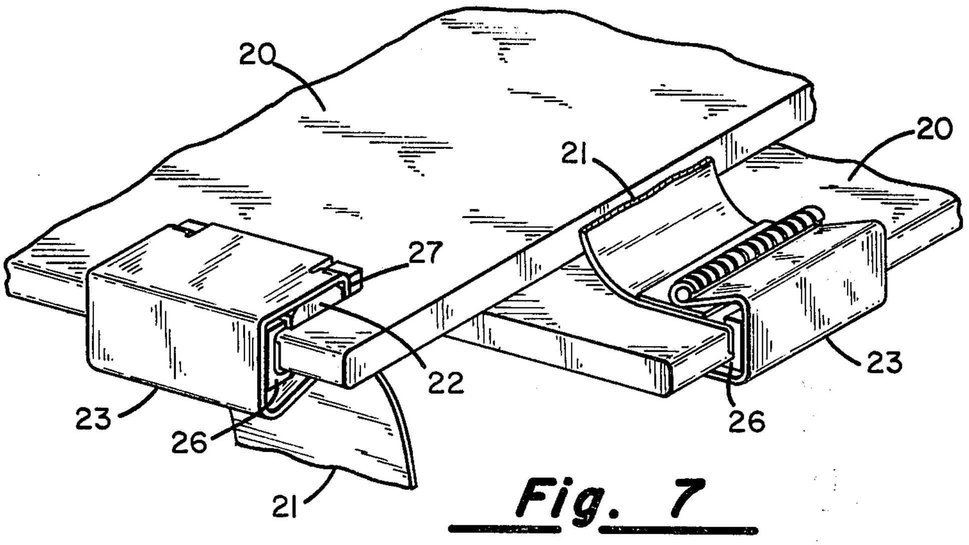
FIG. 7 shows the basic utilization of the present invention of a spring clip electrical connector in securing a flat ribbon cable in low-resistance electrical contact with printed lands on a substrate.

The abbreviated and basic utilization of the present invention of a spring clip electrical connector for securing a flat ribbon cable in low-resistance electrical contact with printed lands on substrates is illustrated in FIG. 7. Flat conductor cable 21 is held in compressive contact with substrates 20 by the action of spring clips 23. The tabs 27 on spring clips 23 contact retaining blocks 22 affixed to substrates 20, of which only one retaining block 22 is visible. The flexible conductor cables 21 are observed to rollover the edges of substrate 20. It is at this substrate's 20 edge position wherein the compressed cellular rubber 26 will affect strong compressive forces serving to retain flexible conductor cable 01 in position. Zero insertion forces of spring clips 23 onto substrates 20, and of flat conductor cables 21 under spring clips 23, may be simultaneously obtained by forcibly spreading spring clips 23 during insertion over properly positioned flat conductor cables 21 and substrates 20. This spreading against the spring bias force may be expediently accomplished by a simple tool such as a plier. Proper lateral alignments of the spring clips 23 are maintained by the retaining blocks 22, of which one retaining block is visible. If flat conductor cables 21 are not initially correctly compressively held, it is a simple matter to spread spring clips 23 with a tool (not shown) and recomplete the connection process until correct alignments are obtained.

Figure 8:
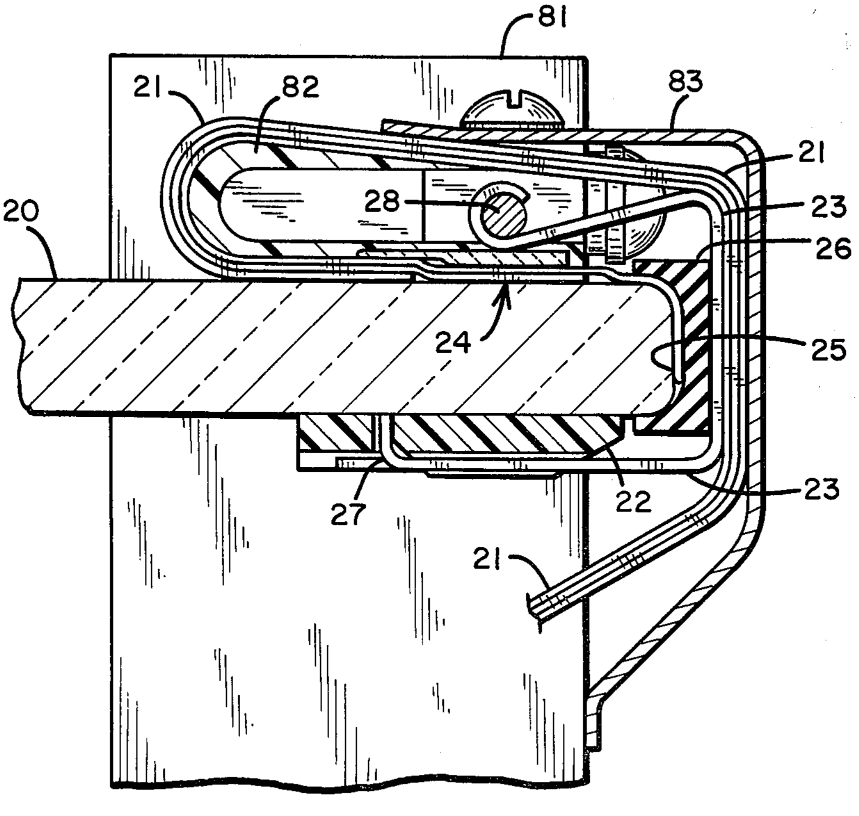
FIG. 8 shows in a side view an expanded attachment system utilizing the present invention of a spring clip electrical connector in conjunction with hold down bars and cable clamps.

A complete attachment system for spring clip electrical connection of printed lands on a printed circuit or glass substrate to flexible cable is shown in FIG. 8. Retaining block 22 is permanently affixed to substrate 20. This retaining block 22 serves as a guide as well as a retainer to spring clip 23. When installed with tabs 27 overlapping retaining block 22, spring clip 23 strongly compresses cellular rubber 26. The flexible conductor cable 21 has the conductors exposed at point 24 under the rolled lip of spring clip 23. The strong compressive force developed by spring clip 23 thereby presses the exposed conductors of flat conductor cable 21 against printed circuit lands on substrate 20 to effect reliable electrical contact. After this electrical connection has been established in this point 24 and while the flat conductor cable 21 is held by the elastomeric force of cellular rubber 26 acting to hold flat conductor cable at the area of edge 25 a metal hold down bar 28 as retained by retaining plate 81 and surrounded by securing cellular rubber 82 may be utilized to secure the flat conductor cable 21. A further securing device of cable clamp 83 may also be employed. All further hold down bars, clamps, shields, beyond the basic utilization of the present invention as shown in FIG. 7 are mere embellishments of a type common in the connector art to the present invention of a spring clip electrical connector for strip conductor cable of a type common in the connector art.

As finally completed the installation is neat, strong, and highly resistant to shock, vibration or deterioration. All components may be readily disassembled and reassembled during field utilization for repair of the underlying structures or components. The parts are, in general, not delicate and withstand considerable handling and assembly/disassembly procedures.

What is claimed is:

1. An electrical connector apparatus for electrically connecting a multiplicity of printed lands upon, and normal to the edge of, a planar substrate to a like multiplicity of stripped conductor ends within a flexible flat cable, which apparatus comprises:

spring clip means generally U-channel shaped with spring force exerting side planes of the U-channel for exerting squeezing compressive high spring first force normal to, and between, the side planes of the U-channel;

elastomeric pad means affixed to the U-channel interior at a base plane of the U-channel of said generally U-channel shaped spring clip means for exerting an elastomeric expansive second force normal to, and into the U-channel from, said base plane of the U-channel;

retention means for affixing both said planar substrate with a multiplicity of printed circuit lands normal to the edge of said substrate, plus said flexible flat cable with said like multiplicity of stripped conductor ends which is bendably disposed, meaning draped, over the edge of said planar substrate, within said U-channel shaped spring clip means so that both said planar substrate and said flexible flat cable draped thereon are directly compressively squeezed by said compressive high spring first force normal to the side planes of the U-channel of said generally U-channel shaped spring clip means, and so that both said planar substrate and said flexible flat cable draped thereon are forcefully and compressively subject to said elastomeric expansive second force, resultant from said elastomeric pad means, normal to the U-channel base plane of the U-channel of said generally U-channel shaped spring clip means;

whereby with said flexible flat cable bendably disposed between said spring clip means and said planar substrate, said squeezing compressive high spring first force serves to compressively electrically contact said multiplicity of stripped conductor ends of said flexible flat cable against said multiplicity of printed circuit lands upon said planar substrate, while said elastomeric expansive second force serves to retain said flexible flat cable between said spring clip means and said planar substrate.

2. The electrical connector apparatus of claim 1 wherein said spring clip means further comprises:

a plurality of finger-like spring segments integral with one of said squeezing compressive high spring first force exerting side planes of said U-channel in order that said squeezing compressive high spring first force, substantially developed in said spring clip means exclusive of said plurality of finger-like spring segments, transmitted therethrough said finger-like spring segments may be substantially equalized in said compressive squeezing, by said compressive high first spring force, of both said planar substrate and said flexible flat cable draped thereon;

whereby said plurality of finger-like spring segments do not substantially develop said compressive high first spring force, but only substantially equalize the transmission thereof such compressive high first spring force.

3. The electrical connector apparatus of claim 1 wherein said spring clip means further comprises:

tabs disposed from one or both of said side planes of said U-channel toward the interior of said U-channel; and wherein said retention means further comprises:

a retainer block affixed to one or both sides of said planar substrate across which retainer block said U-channel shaped spring clip means may be moved during the insertion of both said planar substrate and said flexible flat cable draped thereon said substrate within said U-channel, but which retainer block contacts said corresponding tabs of said side planes of said U-channel shaped spring clip means in order to prevent withdrawal of said planar substrate and said flexible flat cable draped thereon said substrate from said U-channel of said spring clip means in response to said elastomeric expansive second force resultant from said elastomeric pad means.

4. The electrical connector apparatus of claim 1 wherein said elastomeric pad means further comprises: elastomeric pad means of silicone rubber.

5. The electrical connector apparatus of claim 1 wherein said spring clip means further comprises:

spring clip means generally U-channel shaped with a rollover edge at the lip of one side plane of said U-channel, said rollover edge being either toward or away from the interior of said U-channel, said rollover edged lip presenting an arched planar surface to said compressively squeezed planar substrate along the linear path of contact therebetween.

6. The electrical connector apparatus of claim 2 wherein said spring clip means further comprises:

tabs disposed from one or both of said side planes of said U-channel toward the interior of said U-channel; and wherein said retention means further comprises:

a retainer block affixed to one or both sides of said planar substrate across which retainer block said U-channel shaped spring clip means may be moved during the insertion of both said planar substrate and said flexible flat cable draped thereon said substrate within said U-channel, but which retainer block contacts said corresponding tabs of said side planes of said U-channel shaped spring clip means in order to prevent withdrawal of said planar substrate and said flexible flat cable draped thereon said substrate from said U-channel of said spring clip means in response to said elastomeric expansive second force resultant from said elastomeric pad means.

7. The electrical connector apparatus of claim 2 wherein said elastomeric pad means further comprises:

elastomeric pad means of silicone rubber.

8. The electrical connector apparatus of claim 2 wherein said spring clip mean further comprises:

spring clip means generally U-channel shaped with a rollover edge at the lip of one side plane of said U-channel, said rollover being either toward or away from the interior of said U-channel, said rollover edged lip presenting an arched planar surface to said compressively squeezed planar substrate along the linear path of contact therebetween.

9. An electrical connector apparatus for firstly electrically connecting a multiplicity of stripped wire ends within a stripped flexible flat conductor cable to a like multiplicity of printed circuit lands upon a plane of a planar substrate and for secondly providing a clamping force which retains said flat conductor cable in fixed position relative to said substrate, said stripped flexible flat conductor cable being draped across the plane and edge of said planar substrate, said apparatus comprising:

generally U-channel shaped spring clip means for exerting squeezing compressive spring first force, normal to the side planes of the U-channel, against said plane of said planar substrate and said stripped flexible flat conductor cable thereupon said substrate plane as clamped within the U-channel so that by said compressive spring first force said multiplicity of stripped wire ends within said flat conductor cable will be in electrically conductive contact with corresponding said like multiplicity of printed circuit lands upon said plane of said planar substrate, said spring clip means further comprising:

a first side plane of said U-channel ending in a uniform array of cylindrically-rolled-over, backwardly dispersed from the U-channel opening, finger-like spring segments integrally serratedly formed from said first side plane of said U-channel;

a substantially flat base plane to the U-channel; and a second side plane of said U-channel terminating in two or more integrally formed tabs inwardly disposed within said U-channel opening; plus elastomeric pad means affixed to said substantially flat base plane of said U-channel;

retainer block means affixed to said planar substrate upon the opposite side from said first forcible holding of said flat cable, and near said edge plane of said sheet substrate, for positioning and holding the edge side of said sheet substrate with said flexible conductor cable draped thereon within said U-channel by latching said tabs, when said spring clip means are clipped over said sheet substrate with flexible conductor cable draped across the plane and edge, so that said U-channel base plane affixed elastomeric pad means are compressed;

whereby, when clipped, a first compressive electrical connection by a first clamping force is provided by said squeezing compressive spring force, and whereby a second holding clamping force normal to said edge plane of said substrate is provided by said compressed elastomeric pad means.

* * * * *